United States Patent [19]
Eisenberg et al.

[11] Patent Number: 5,607,543
[45] Date of Patent: Mar. 4, 1997

[54] INTEGRATED CIRCUIT ETCHING

[75] Inventors: Juli H. Eisenberg, Allentown, Pa.;
Susan C. Vitkavage, Orlando, Fla.

[73] Assignee: Lucent Technologies Inc., Murray Hill, N.J.

[21] Appl. No.: 431,341

[22] Filed: Apr. 28, 1995

[51] Int. Cl.$^6$ .................................................. H01L 21/30
[52] U.S. Cl. ........................... 156/662.1; 156/651.1; 156/652.1; 156/653.1; 437/228
[58] Field of Search ........................... 156/662.1, 651.1, 156/653.1, 657.1; 437/228; 252/79.1, 79.2

[56] References Cited

U.S. PATENT DOCUMENTS

| | | |
|---|---|---|
| 3,715,249 | 2/1973 | Panousis . |
| 5,002,898 | 3/1991 | Fritzinger et al. . |
| 5,215,930 | 6/1993 | Lee et al. .................................. 437/40 |
| 5,310,457 | 5/1994 | Ziger ........................................ 156/657 |
| 5,437,765 | 8/1995 | Loewenstein ............................ 216/51 |

FOREIGN PATENT DOCUMENTS

| | | |
|---|---|---|
| 158289 | 1/1983 | Germany . |
| 275344 | 1/1990 | Germany . |

OTHER PUBLICATIONS

"Silicon Processing For The VLSI Era–vol. 2–Process Integration"; Wolf; Lattice Press, Sunset Beach, Ca.; ©1990; pp. 17–32.

A New Deglase Process for Doped Polysilicon Larry, Lowell, Polaroid Corporation, Microelectronics Laboratory, Cambridge, Massachusetts. Apr. 1991, Solid State Technology, pp. 149–153.

Thin Film Processes, John L. Vossen and Werner Kern, RCA Laboratories, David Sarnoff Research Center, Princeton, New Jersey.

Characterization of Poly–Buffered LOCOS in Manufacturing Environment, R. L. Guldi, B. McKee, G. M. Damminga, C. Y. Yong and M. A. Beals, Texas Instruments Incorporated, Logic Operations, Semiconductor Group, Dallas, Texas.

J. Electrochem 1967, p. 423.

*Primary Examiner*—R. Bruce Breneman
*Assistant Examiner*—George Goudreau
*Attorney, Agent, or Firm*—John T. Rehberg

[57] ABSTRACT

A process for removing both the silicon nitride layer and polysilicon layer in a poly-buffered LOCOS process which utilizes hot phosphoric acid and nitric acid is disclosed.

7 Claims, 1 Drawing Sheet

INTEGRATED CIRCUIT ETCHING

TECHNICAL FIELD

This invention relates to integrated circuit manufacturing in general, and more particularly to etching processes utilized in silicon semiconductor integrated circuits.

BACKGROUND OF THE INVENTION

In the initial stages of conventional silicon integrated circuit processing, a silicon substrate is covered by a pad oxide and a silicon nitride layer. The silicon nitride and pad oxide are subsequently patterned to expose predetermined regions of more or less bare silicon. An oxidation step is performed to create a field oxide, sometimes called an isolation oxide, in the regions where bare silicon had been exposed. The above-described process is often termed the LOCOS process ("local oxidation of silicon").

A variant of the LOCOS process is the poly-buffered LOCOS process in which a layer of polysilicon is formed between the pad oxide and the silicon nitride layer. The polysilicon layer helps to relieve stresses created during the growth of the field oxide.

In both the LOCOS and the poly-buffered LOCOS processes, after the field oxide is grown, it is desirable to remove both the silicon nitride and the polysilicon layer (if it is employed). (Frequently, the underlying pad oxide is also removed.) Typically, the silicon nitride layer is removed by etching in hot phosphoric add. The polysilicon layer is subsequently removed by a dry etch process. Unfortunately, the phosphoric acid wet etch often used to remove the silicon nitride creates small pits in the polysilicon. The dry etch process which is subsequently utilized to remove the polysilicon, being anisotropic, transfers the pits in the polysilicon downward into the pad oxide or, under over-etch conditions, into the silicon substrate. This pitting of the pad oxide and the underlying substrate is undesirable.

SUMMARY OF THE INVENTION

Risk of damage to the pad oxide or underlying substrate is alleviated by the present invention which utilizes phosphoric acid and nitric add to etch both polysilicon and silicon nitride layers.

DETAILED DESCRIPTION

Figure 1:
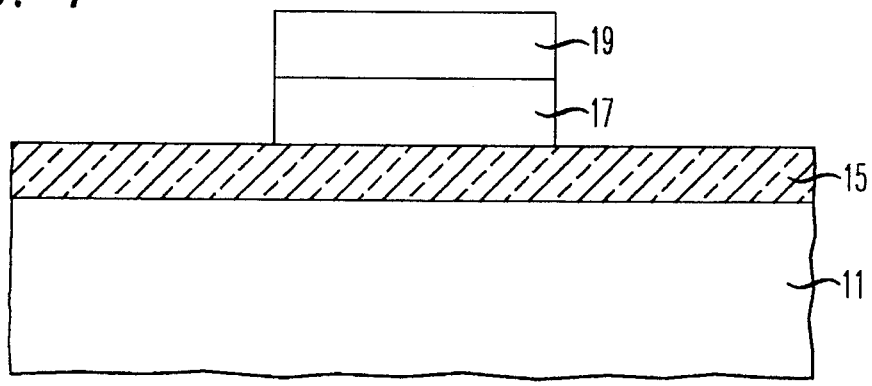
FIGS. 1–3 are cross-sectional views of an integrated circuit, which are helpful in understanding the principles of the invention.

In FIG. 1, reference numeral 11 denotes a substrate which may be silicon, doped silicon, epitaxial silicon, etc. In general, the term substrate is used to refer to any material having a surface upon which other materials may be adhered or deposited. Pad oxide 15, polysilicon layer 17, and silicon nitride layer 19 have been deposited upon substrate 11, and polysilicon layer 17 and silicon nitride layer 19 have been subsequently patterned. (In some processes, polysilicon layer 17 is not patterned, and the polysilicon is consumed in the subsequent field oxide oxidation process.) A wide range of thicknesses for layers 15, 17, and 19 is common in the semiconductor industry.

After polysilicon layer 17 has been formed (and before silicon nitride layer 19 is formed), the upper surface of polysilicon layer 17 is cleaned in, for example, 100:1 HF for approximately two minutes or in 15:1 HF for approximately one minute. The cleaning step removes any oxide which may have formed on the upper surface of the polysilicon. Removal of the oxide facilitates subsequent wet etching of polysilicon layer 17. If the oxide is not removed, it resists attack by phosphoric acid and considerably impedes removal of polysilicon layer 17.

After the cleaning step, the wafer is not exposed for any significant period of time to room ambient (to prevent re-oxidation) and nitride formation is begun without significant delay.

Previously-employed removal techniques, which included dry-etching of the polysilicon, do not include a cleaning step prior to nitride formation.

Figure 2:
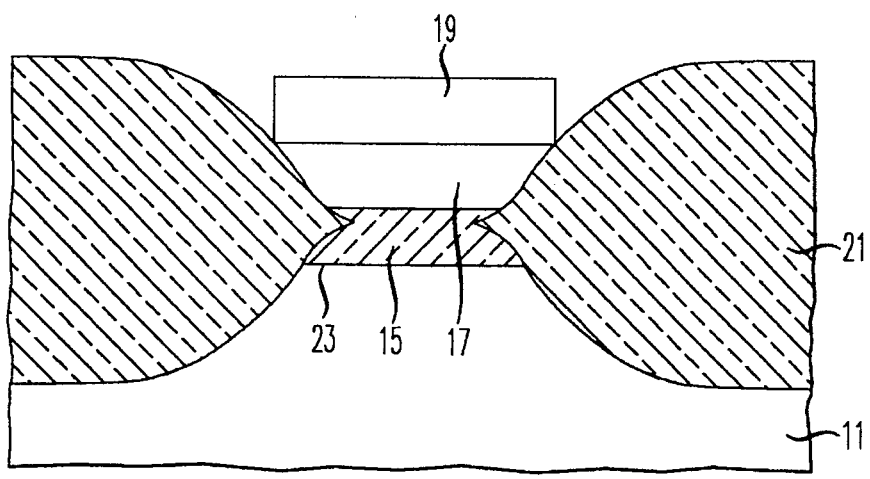

In FIG. 2, field oxide 21 has been grown, for example, by thermal oxidation in steam. Other methods of oxidation may also be employed, such as oxidation in dry oxygen (which requires more time) or high pressure oxidation (which is less easily controlled). It is then desirable to remove both silicon nitride layer 19 and polysilicon layer 17 without significant risk of damage to underlying pad oxide 15 or upper substrate surface 23. Before attempting to remove both layers 19 and 17, another cleaning step, utilizing 15:1 HF for approximately two minutes is performed to remove any silicon dioxide or silicon oxynitride which may have formed on the upper surface of layer 19. (The presence of silicon dioxide or silicon oxynitride will inhibit the effectiveness of the subsequent wet etch.)

Approximately two minutes is sufficient for the cleaning step if the field oxide has been grown in steam to a thickness of 5000–6000 Å. Shorter time periods (e.g., one and one-half minutes) may be suitable for thinner field oxides or field oxides formed by high pressure oxidation.

Our process for removing both layers 19 and 17 employs hot phosphoric acid, $H_3PO_4$ and nitric acid $HNO_3$. The hot phosphoric acid and nitric acid removes both the silicon nitride and the underlying polysilicon. In a first embodiment, the phosphoric acid and nitric acid are in a single bath at a temperature of 140° C.–200° C. (A temperature of 165° C. seems to provide adequate removal of nitride and polysilicon without causing undue equipment corrosion.) Higher acid temperature promotes quicker nitride/polysilicon removal. Whatever temperature is chosen, the phosphoric acid concentration may be selected anywhere between fully concentrated (i.e., approximately 95%) and that concentration at which the acid solution bath boils.

The etch rate of single crystalline silicon is at least two times less than the etch rate of silicon dioxide. Thus, the etch process is highly selective to silicon dioxide (and crystalline silicon).

In other words, the etch rates of silicon nitride, polysilicon, and silicon dioxide, respectively, are in the ratio 80:20:1. The goal of the etching process is to completely strip the silicon nitride 19 and polysilicon 17 without significant damage to underlying silicon dioxide 15 or crystalline silicon 11. Consequently, the desired thickness of the underlying silicon dioxide 15, relative to the thicknesses of the polysilicon 17 and silicon nitride 19 is given by the formula (assuming a safety factor of 2):

$$\left(\frac{A}{80} + \frac{B}{20}\right) \times S \leq C$$

where
A=thickness of silicon nitride layer,
B=thickness of polysilicon layer,
C=thickness of silicon dioxide,
S=safety factor (typically=2).
Depending on the application, safety factors greater or less than 2 may be acceptable.

Applicants have found that the growth process which produces field oxide 21 induces high stresses in the adjacent polysilicon layer 17. The stressed polysilicon layer 17 etches at a rate somewhat greater than the rate of 13 Å/min. mentioned above (which was obtained on an unstressed sample).

Figure 3:
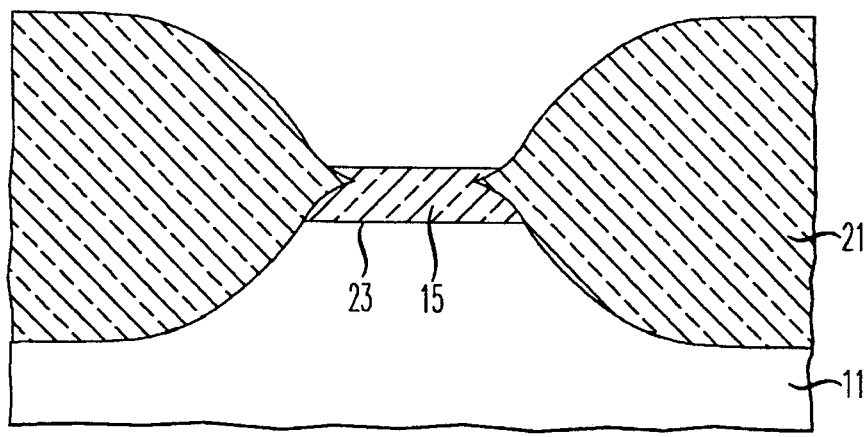

FIG. 3 illustrates the structure of FIGS. 1 and 2 after layers 17 and 19 have been removed, leaving only pad oxide 15. Subsequent processing may then be performed in accordance with conventional semiconductor practice.

We have found that the effectiveness of the wet etch process described above may be enhanced by the addition of nitric acid to the phosphoric acid bath. Addition of 100 ml–200 ml nitric acid to a five gallon bath of phosphoric acid is desirable. (If the bath is cool (room temperature), the nitric acid concentration may be near 20%. If the bath is hot, i.e., 165° C.–180° C., the nitric acid concentration may be reduced to as low as 3–5% since the nitric acid will boil away.) Using a heated (165°–180° C.) bath to which 3–5% nitric acid was added (when the bath was hot), an etch rate of 20 Å/min. for polysilicon and 60 Å/min. for silicon nitride was observed. Using 20% nitric acid, for example, at 165° C. with at least a partially boiling bath, etch rates of approximately 55 Å/min. have been observed for silicon nitride; 13 Å/min. have been observed for polysilicon; and 0.7 Å/min. have been observed for silicon dioxide. Thus, addition of the nitric acid improves the polysilicon etch rate without significantly affecting selectivity with respect to oxide. Furthermore, bath life is improved when 3% nitric acid is added.

In a second embodiment, a two step wet etching process is employed. It is believed that, with time, a bath containing nitric acid becomes slowly contaminated with dissolved materials from production wafers and the initial concentration of nitric acid decreases. Thus, the effectiveness of a bath with nitric acid for etching the polysilicon layer diminishes over time, and the bath must be replaced comparatively frequently. In the two-step process, the bulk of the silicon nitride is removed in the first bath. This bath is composed of hot phosphoric acid only, and the etch time is approximately 80 minutes. The second step of the etch (approximately 20 minutes) is used to etch through the silicon nitride-polysilicon interface, and the bath is made up with hot phosphoric and an initial 25% solution of $HNO_3$. Loading effects are minimized during this second step as a comparatively small amount of material is removed in the second step. Therefore, use of a two-step removal technique allows for minimization of any aging effects. In addition, since the bulk removal occurs in the first step, contamination during the second (and final) step will be minimized.

We claim:

1. A method of semiconductor integrated circuit fabrication comprising:

forming a layer of polysilicon overlying a substrate;

forming a layer of silicon nitride overlying said layer of polysilicon;

subjecting said substrate having said layer of polysilicon and said layer of silicon nitride to a first bath comprised of phosphoric acid which does not contain nitric acid, and then to a second bath comprising phosphoric and nitric acid, thereby removing said layer of polysilicon and said layer of silicon nitride.

2. The method of claim 1 in which a layer of silicon dioxide underlies said layer of polysilicon.

3. The method of claim 1 in which the upper surface of said polysilicon layer is cleaned prior to formation of said silicon nitride layer.

4. The, method of claim 3 in which said cleaning step utilizes HF.

5. The method of claim 1 in which the upper surface of said silicon nitride layer is cleaned prior to said subjecting step.

6. The method of claim 5 in which said cleaning step utilizes HF.

7. The method of claim 2 further including the steps of:

removing said silicon dioxide layer to expose said substrate;

forming at least one transistor upon said substrate.

\* \* \* \* \*